United States Patent
Kawano

(10) Patent No.: US 8,252,611 B2
(45) Date of Patent: *Aug. 28, 2012

(54) BUFFER LAYER AND MANUFACTURING METHOD THEREOF, REACTION SOLUTION, PHOTOELECTRIC CONVERSION DEVICE, AND SOLAR CELL

(75) Inventor: Tetsuo Kawano, Ashigarakami-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/898,403

(22) Filed: Oct. 5, 2010

(65) Prior Publication Data

US 2011/0081744 A1    Apr. 7, 2011

(30) Foreign Application Priority Data

Oct. 6, 2009 (JP) ................. 2009-232276
Jun. 8, 2010 (JP) ................. 2010-131000

(51) Int. Cl.
    *H01L 21/00*    (2006.01)

(52) U.S. Cl. ........... 438/22; 438/497; 257/E25.008; 257/E33.001

(58) Field of Classification Search ............ 438/22, 438/29, 48, 497, 762, 782, 788; 257/E27.125, 257/E25.008, E33.001; 136/256

See application file for complete search history.

(56) References Cited

U.S. PATENT DOCUMENTS

| | | | |
|---|---|---|---|
| 7,704,863 B2 * | 4/2010 | Ennaoui et al. | 438/497 |
| 2008/0276987 A1 * | 11/2008 | Flood | 136/256 |

FOREIGN PATENT DOCUMENTS

| JP | 2000-332280 A | 11/2000 |
|---|---|---|
| JP | 2001-196611 A | 7/2001 |
| JP | 2002-118068 A | 4/2002 |
| JP | 2002-343987 A | 11/2002 |
| JP | 2003-124487 A | 4/2003 |
| JP | 2007-242646 A | 9/2007 |

OTHER PUBLICATIONS

J.M Dona, et al. "Processing and film Characterization of Chemcial-Bath-Deposited ZnS thin film", J electrochemical Soc. Jan. 1994, p. 205-209, vol. 141, No. 1 (applicant submitted art see IDS).*

(Continued)

*Primary Examiner* — William D Coleman
*Assistant Examiner* — Su Kim
(74) *Attorney, Agent, or Firm* — Sughrue Mion, PLLC

(57) ABSTRACT

A buffer layer manufacturing method, including the steps of forming a fine particle layer of ZnS, Zn(S, O), and/or Zn(S, O, OH), mixing an aqueous solution (I) which includes a component (Z), an aqueous solution (II) which includes a component (S), and an aqueous solution (III) which includes a component (C) to obtain a mixed solution and mixing an aqueous solution (IV) which includes a component (N) in the mixed solution to prepare a reaction solution in which the concentration of the component (C) is 0.001 to 0.25M, concentration of the component (N) is 0.41 to 1.0M, and the pH before the start of reaction is 9.0 to 12.0, and, using the reaction solution, forming a Zn compound layer of Zn(S, O) and/or Zn(S, O, OH) on the fine particle layer by a liquid phase method with a reaction temperature of 70 to 95° C.

21 Claims, 4 Drawing Sheets

OTHER PUBLICATIONS

J. M. Dona, et al., "Process and Film Characterization of Chemical-Bath-Deposited ZnS Thin Film", J. Electrochemical Soc., Jan. 1994, pp. 205-209, vol. 141, No. 1.

F. Gode, et al., "Investigations on the Physical Properties of the Polycrystalline ZnS Thin Films Deposited by the Chemical Bath Deposition Method", Journal of Crystal Growth, 2007, pp. 136-141, vol. 299.

D. Johnston, et al., "Chemical Bath Deposition of Zinc Sulphide Thin Films Using Sodium Citrate as a Complementary Conplexing Agent", Journal of Materials Science Letters, 2001, pp. 921-923, vol. 20.

Hyun Joo Lee, et al., Deposition and Optical Properties of Nanocrystalline ZnS Thin Films by a Chemical Method, Current Applied Physics, 2007, pp. 193-197, vol. 7.

J. Nanda, et al., "Size-Selected Zinc Sulfide Nanocrystallites: Synthesis, Structure, and Optical Studies", Chem. Materials, 2000, pp. 1018-1024, vol. 12.

Gary Hodes, "Semiconductor and Ceramic Nanoparticle Films Deposited by Chemical Bath Deposition", Physical Chemistry Chemical Physics, 2007, pp. 2181-2196, vol. 9.

C. Hubert, et al., "A Better Understanding of the Growth Mechanism of Zn (S. O. OH) Chemical Bath Deposited Buffer Layers for High Efficiency Cu (In, Ga) (S, Se)$_2$ Solar Cells", Phys. Stat. Sol., 2008 pp. 2335-2339, vol. 205, No. 10.

C. Hubert, et al., "Thermodynamic and Experimental Study of Chemical Bath Deposition of Zn (S, O, OH) Buffer Layers in Basic Aqueous Ammonia Solutions. Cell Results with Electrodeposited CuIn (S, Se)$_2$ Absorbers", Thin Solid Films, 2007, pp. 6032-6035, vol. 515.

Satoshi Yamabi, et al., "Growth Conditions for Wurtzite Zinc Oxide Films in Aqueous Solutions", Journal of Materials Chemistry, 2002, pp. 3773-3778, vol. 12.

B.C. Bunker, et al., "Ceramic Thin-Film Formation on Functionalized Interfaces Through Biomimetic Processing", Science, 1994, pp. 48-55, vol. 264, No. 5155.

W. Vogel, "Structure and Stability of Monodisperse 1.4-nm ZnS Particles Stabilized by Mercaptoethanol", Langmuir, 2000, pp. 2032-2037, vol. 16.

* cited by examiner

BUFFER LAYER AND MANUFACTURING METHOD THEREOF, REACTION SOLUTION, PHOTOELECTRIC CONVERSION DEVICE, AND SOLAR CELL

BACKGROUND OF THE INVENTION

1. Field of the Invention

The present invention relates to a buffer layer included in a photoelectric conversion device and a manufacturing method thereof, a reaction solution for use in manufacturing the buffer layer included in a photoelectric conversion device, a photoelectric conversion device having the buffer layer, and a solar cell using the photoelectric conversion device.

2. Description of the Related Art

Photoelectric conversion devices having a photoelectric conversion layer and electrodes conducting to the photoelectric conversion layer are used in various applications, including solar cells and the like. Most of the conventional solar cells are Si-based cells using bulk single-crystalline Si, polycrystalline Si, or thin film amorphous Si. Recently, however, research and development of compound semiconductor-based solar cells that do not depend on Si has been carried out. Two types of compound semiconductor-based solar cells are known, one of which is a bulk system, such as GaAs system and the like, and the other of which is a thin film system, such as CIS system formed of a group Ib element, a group IIIb element, and a group VIb element, CIGS, or the like. The CI(G)S system is a compound semiconductor represented by a general formula, $Cu_{1-z}In_{1-x}Ga_xSe_{2-y}S_y$, (where, $0 \leq x \leq 1$, $0 \leq y \leq 2$, $0 \leq z \leq 1$), and when x=0 the formula represents a CIS system, while when x>0 it represents a CIGS system. The CIS and CIGS are herein collectively denoted as "CI(G)S".

Conventional thin film photoelectric conversion devices, such as CI(G)S systems and the like, generally include a CdS buffer layer between a photoelectric conversion layer and a translucent conductive layer (transparent electrode) formed thereon. In such a system, the buffer layer is normally formed by CBD (chemical bath deposition) method Roles of the buffer layer may include (1) prevention of recombination of photogenerated carriers (2) band discontinuity alignment (3) lattice matching (4) coverage of surface unevenness of the photoelectric conversion layer, and the like. For CI(G)S systems and the like, the CBD method, which is a liquid phase method, is preferably used in order to satisfy, in particular, the condition of (4) above, since the photoelectric conversion layer has relatively large surface unevenness.

In view of the environmental burden, Cd-free buffer layers are under study, and as a major component of Cd-free buffer layers, use of zinc systems, such as ZnO systems, ZnS systems, and the like is also under study.

Japanese Unexamined Patent Publication No. 2000-332280 (Patent Document 1) discloses a method of producing a Zn(O, OH, S) buffer layer using a reaction solution that includes a zinc-containing compound, a sulfur-containing compound, and an ammonium salt (claim 1). Patent Document 1 also describes that a reaction solution that includes 0.5 mol/l or less of ammonia is preferably used (claim 2). Patent Document 1 further describes that a reaction temperature of 10 to 100° C. and a pH of 9.0 to 11.0 are preferable (claims 6 and 7).

Japanese Unexamined Patent Publication No. 2001-196611 (Patent Document 2) discloses a method of producing a Zn(S, O) buffer layer using a reaction solution containing zinc acetate, thiourea, and ammonia (Example 3). In Example 3 of Patent Document 2, concentrations of the zinc acetate, thiourea, and ammonia are 0.025M, 0.375M, and 2.5M, respectively.

Japanese Unexamined Patent Publication No. 2002-343987 (Patent Document 3) discloses a method of producing a Zn(S, O, OH) buffer layer using a reaction solution which is a mixture of a solution provided by dissolving zinc salt in ammonia water or ammonium hydroxide water and an aqueous solution provided by dissolving sulfur-containing salt in purified water (claim 1). Patent Document 3 describes that the film forming is performed with a transparency level of the reaction solution of 100% to 50% (claim 1). Patent Document 3 further describes that a reaction temperature of 80 to 90° C. and a pH of 10.0 to 13.0 are preferable (claims 5 and 6).

Japanese Unexamined Patent Publication No. 2003-124487 (Patent Document 4) discloses a method of producing a Zn(S, O) buffer layer by a roll-to-roll process using a reaction solution containing zinc acetate, thiourea, and ammonia. In Example 2 of Patent Document 4, concentrations of the zinc acetate, thiourea, and ammonia are 0.025M, 0.375M, and 2.5M, respectively.

Japanese Unexamined Patent Publication No. 2002-118068 (Patent Document 5) discloses a method of producing a ZnS buffer layer using a reaction solution containing zinc sulfate, ammonia, and thiourea (claim 4). U.S. Pat. No. 7,704,863 (Patent Document 6) discloses a method of producing a buffer layer which includes the steps of dissolving a 0.05 to 0.5 mol/l of zinc sulfate and a 0.2 to 1.5 mol/l of thiourea in distilled water at a temperature of 70 to 90° C., adding about 25% ammonia in the amount of ⅓ of the water, and after the solution becomes transparent, dipping the substrate in the solution for about 10 minutes to maintain the temperature substantially at constant within the time (claim 1).

A literature by D. Johnston et al., "Chemical bath deposition of zinc sulphide thin films using sodium citrate as a complementary complexing agent", Journal of Materials Science Letters, Vol. 20, pp. 921-923, 2001 (Non-patent Document 1) describes a method of producing a ZnS thin film using a reaction solution containing zinc sulfate, thiourea, ammonia, and sodium citrate. In Non-patent Document 1, the film forming is performed at a reaction temperature of 60 to 80° C.

A literature by H. J. Lee and S. I. Lee, "Deposition and optical properties of nanocrystalline ZnS thin films by a chemical method", Current Applied Physics, Vol. 7, Issue 2, pp. 193-197, 2007 (Non-patent Document 2) describes a method of producing a ZnS thin film using a reaction solution containing zinc sulfate and thioacetamide. In Non-patent Document 2, the film forming is performed at a reaction temperature of 95° C. with a reaction time of 90 to 120 min.

When providing a buffer layer by CBD method, it is necessary to form a film that well covers an underlayer. Further, in view of the production efficiency and cost, a high reaction speed is preferable in the film forming process for the buffer layer by CBD method.

Japanese Unexamined Patent Publication No. 2007-242646 (Patent Document 7) discloses a method of forming a buffer layer by providing a nucleation site or a growing site, which is a particle of the same kind as or a different kind from that of the buffer layer, and forming the buffer layer with the nucleation site or the growing site as the starting point or the catalyst (claim 1). Further, ZnS is specifically cited as a major component of the particle serving as the nucleation site or the growing site and the buffer layer (claim 8).

As described in Patent Document 7, by growing a CBD film after forming a fine particle layer that functions as the nucleation site or the growing site of crystal growth, catalyst, or the like, the reaction speed of the CBD film forming process may be increased and a film well covering an underlayer may be formed stably by controlling the crystal growth through CBD reaction.

In the CBD reaction, colloidal particles are generated as the reaction progresses and the reaction solution sometimes becomes opaque white. When the white opaque becomes significant, colloidal particles may adhere to the substrate and a uniform film becomes unable to be formed. In such a case, it is necessary to take measures, such as replacing the reaction solution with respect to each or several substrates. For example, Patent Document 5 discloses a method for performing CBD film forming by replacing the reaction solution (claim 1).

Patent Document 3 describes that a Zn system buffer layer is formed within a transparency range of the reaction solution from 100 to 50% (claim 1). Patent Document 3 also describes a method in which transparency of the reaction solution is monitored and a substrate is pulled out of the reaction solution when the transparency becomes 70 to 50% (claims 3 and 4, and the like). Patent Document 3 does not describe the relationship between prescription and transparency, and it is not clear that what prescription may prevent white opaque. The method described in Patent Document 3 can not form a buffer layer having a sufficient thickness if a reaction solution likely to become opaque white is used.

Patent Document 4 discloses a manufacturing apparatus having a means for removing sediment from a reaction solution (claim 9). Removal of sediment may prevent colloidal particles from adhering to the substrate, but the problem of replacement frequency for the reaction solution is not solved since the composition of the reaction solution varies with time from the initial composition.

In order to stably obtain uniform films with less replacement frequencies for the reaction solution, it is preferable that the generation of colloidal particles is prevented as long as possible and the white opaque of the reaction solution is prevented.

The present invention has been developed in view of the circumstances described above, and it is an object of the present invention to provide a reaction solution in which the generation of colloidal particles is prevented as long as possible and the reaction solution is prevented from becoming opaque white, thereby allowing a Zn system buffer layer well covering an underlayer to be formed. It is a further object of the invention to provide a manufacturing method of a Zn system buffer layer well covering an underlayer by preventing colloidal particle adhesion.

SUMMARY OF THE INVENTION

A buffer layer manufacturing method of the present invention is a method of manufacturing a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the method comprising:

a fine particle layer forming step for forming a fine particle layer of a plurality of one kind or two or more kinds of fine particles consisting primarily of at least one kind selected from the group consisting of ZnS, Zn(S, O), and Zn(S, O, OH) on the photoelectric conversion semiconductor layer;

a preparation step for preparing a reaction solution which includes a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:

the concentration of the component (C) is 0.001 to 0.25M;
the concentration of the component (N) is 0.41 to 1.0M; and
the pH before the start of reaction is 9.0 to 12.0; and a film forming step for forming, using the reaction solution, a Zn compound layer consisting primarily of Zn(S, O) and/or Zn(S, O, OH) on the fine particle layer by a liquid phase method with a reaction temperature of 70 to 95° C., wherein, in the preparation step, an aqueous solution (I) which includes the component (Z), an aqueous solution (II) which includes the component (S), an aqueous solution (III) which includes the component (C), and an aqueous solution (IV) which includes the component (N) are prepared separately, then the aqueous solutions (I), (II), and (III) are mixed to obtain a mixed solution, and the aqueous solution (IV) is mixed in the mixed solution.

The term "consisting primarily of XXX" as used herein refers to that XXX accounts for 20% by mass or more unless otherwise specifically described.

A reaction solution of the present invention is a solution for use in manufacturing a Zn compound layer consisting primarily of Zn(S, O) and/or Zn(S, O, OH) included in a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the solution including:

a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:

the concentration of the component (C) is 0.001 to 0.25M;
the concentration of the component (N) is 0.41 to 1.0M; and
the pH before the start of reaction is 9.0 to 12.0.

According to the present invention, a reaction solution prevented from becoming opaque white as long as possible by preventing the generation of colloidal particles is provided, thereby allowing a Zn system buffer layer well covering an underlayer to be formed.

DESCRIPTION OF THE PREFERRED EMBODIMENTS

Figure 1:
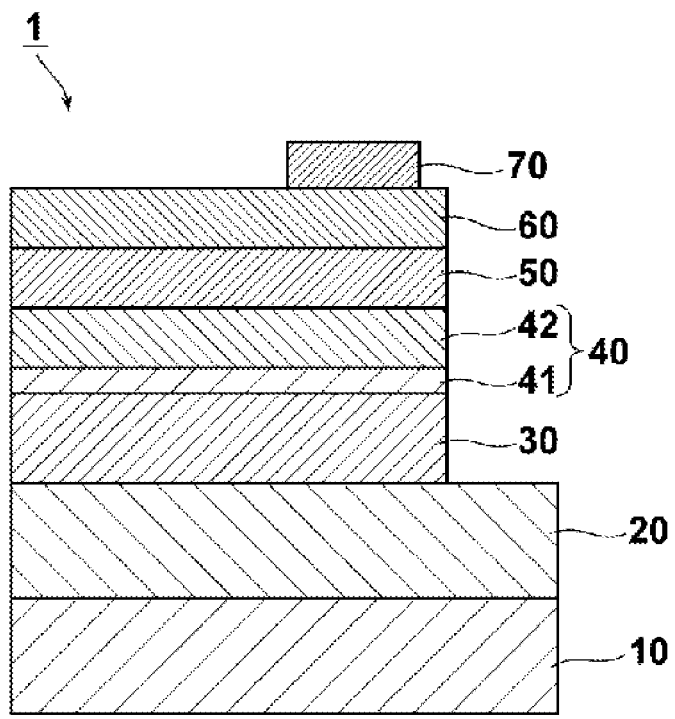
FIG. 1 is a schematic cross-sectional view of a photoelectric conversion device according to an embodiment of the present invention.

Hereinafter, the present invention will be described in detail.

[Buffer Layer Manufacturing Method]

The present invention relates to a buffer layer which includes a Zn compound layer consisting primarily of Zn(S, O) and/or Zn(S, O, OH) and a manufacturing method thereof.

The buffer layer manufacturing method of the present invention is a method of manufacturing a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the method including:

a fine particle layer forming step for forming a fine particle layer of a plurality of one kind or two or more kinds of fine particles consisting primarily of at least one kind selected from the group consisting of ZnS, Zn(S, O), and Zn(S, O, OH) on the photoelectric conversion semiconductor layer;

a preparation step for preparing a reaction solution which includes a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:

the concentration of the component (C) is 0.001 to 0.25M;

the concentration of the component (N) is 0.41 to 1.0M; and the pH before the start of reaction is 9.0 to 12.0; and a film forming step for forming, using the reaction solution, a Zn compound layer consisting primarily of Zn(S, O) and/or Zn(S, O, OH) on the fine particle layer by a liquid phase method with a reaction temperature of 70 to 95° C., wherein, in the preparation step, an aqueous solution (I) which includes the component (Z), an aqueous solution (II) which includes the component (S), an aqueous solution (III) which includes the component (C), and an aqueous solution (IV) which includes the component (N) are prepared separately, then the aqueous solutions (I), (II), and (III) are mixed to obtain a mixed solution, and the aqueous solution (IV) is mixed in the mixed solution.

<Fine Particle Layer Forming Step>

In the buffer layer forming method of the present invention, a fine particle layer consisting primarily of at least one kind selected from ZnS, Zn(S, O), and Zn(S, O, OH) is formed prior to forming a Zn compound layer consisting primarily of Zn(S, O) and/or Zn(S, O, OH) by a liquid phase method.

The fine particle layer allows the film forming speed of a Zn compound layer by the liquid phase method in a latter step to be increased and the crystal growth of the Zn compound layer by the liquid phase method in the latter step to be well controlled, whereby a Zn film well covering an underlayer may be formed at a practical reaction speed. Although not exactly clear, it is believed that the fine particle layer can function as a nucleation site or a growing site (seed crystal), i.e., an origin of the crystal growth or can function as a catalyst for the crystal growth. Further, although not exactly clear, it is believed that the fine particle layer may sometimes have a function to promote spontaneous nucleation in the reaction solution and the like.

Preferably, the fine particle forming step is implemented by a method of applying a dispersion liquid containing a plurality of fine particles (fine particle dispersion liquid) or depositing a plurality of fine particles by a CBD (chemical bath deposition) method.

There is not any specific restriction on the solvent of the fine particle dispersion liquid, and water, various kinds of alcohols, methoxypropyl acetate, toluene, and the like may be used. Where there is not any particular restriction, water is preferably used as the solvent since it is eco-friendly.

The plurality of particles in the fine particle dispersion liquid may be those synthesized or purchased from the market. In the case of ZnS fine particles, they may be formed by the method described, for example, in J. Nanda et al., "Size-Selected Zinc Sulfide Nanocrystallites Synthesis, Structure, and Optical Studies", Chemistry of Materials, Vol. 12, No. 4, pp. 1018-1024, 2000 or W. Vogel et al., "Structure and Stability of Monodisperse 1.4-nm ZnS Particles Stabilized by Mercaptoethanol", Langmuir, Vol. 16, No. 4, pp. 2032-2037, 2000. In the case of Zn(S, O) or Zn(S, O, OH) fine particles, as will be described in a fine particle layer forming step under [Examples], fine particles may be formed by heating Reaction Solution 2, for example, to 90° C. without dipping a substrate therein.

There is not any specific restriction on the particle concentration (solid content concentration) in the fine particle dispersion liquid, and 1 to 50 mass % is preferable. There is not any restriction on the application method of the fine particle dispersion liquid, and preferable methods include dipping method in which the substrate is dipped in the fine particle dispersion liquid, spray coating method, dip coating method, spin coating method, and the like. After the fine particle dispersion liquid is applied to the substrate, a fine particle layer may be formed through the step of removing the solvent. In this case, the substrate may be heated, as required.

A fine particle layer may also be formed by directly applying a plurality of dry particles obtained by heating the fine particle dispersion liquid to the substrate.

The "CBD method" as used herein refers to a method of depositing a crystal on a substrate at a moderate speed in a stable environment using, as the reaction solution, a metal ion solution having a concentration and a pH that induce supersaturation by the equilibrium represented by a general formula, $[M(L)_i]^{m+} \Leftrightarrow M^{n+} + iL$ (where, M is a metal element, L is the ligand, and m, n, and i are positive numbers), and forming complexes of metal ion M. As for the method of depositing a plurality of fine particles on a substrate by CBD method, a method described, for example, in G. Hodes, "Semiconductor and ceramic nanoparticle films deposited by chemical bath deposition", Physical Chemistry Chemical Physics, Vol. 9, pp. 2181-2196, 2007 or the like may be cited.

In the present invention, the major component of the fine particle layer is at least one kind selected from the group consisting of ZnS, Zn(S, O), and Zn(S, O, OH). The use of a major component identical in kind to that of the Zn compound layer formed by a liquid phase method allows the Zn compound layer by the liquid phase method to be grown favorably. Although the major component of the Zn compound layer formed by the liquid phase method is Zn(S, O) and/or Zn(S, O, OH), ZnS may be used as the major component of the fine particle layer.

There is not any specific restriction on the shape of a plurality of fine particles constituting the fine particle layer. As for the fine particle layer, a fine particle layer which includes fine particles having at least one of a rod-like shape, a plate-like shape, and a spherical shape.

As the crystal growth in the latter step progresses uniformly over the entire substrate, it is preferable that the variations in the shape and size of a plurality of fine particles constituting the fine particle layer are small. There is not any specific restriction on the density of a plurality of fine particles applied to the substrate. If the density of the plurality of fine particles applied to the substrate is too low, the function as the nucleation site or the growing site of and/or catalyst for crystal growth may not be fully exercised. Therefore, a high density of the plurality of fine particles applied to the substrate is preferable. Preferably, the plurality of fine particles is applied so as to cover the entire substrate.

There is not any specific restriction on the film thickness of the fine particle layer, and the thickness is preferable to be 2 nm to 1 μm since the crystal growth of the Zn compound layer by liquid phase method can be controlled favorably. As the reaction progresses uniformly over the entire substrate, it is preferable that the in-plane variation in the film thickness of the fine particle layer is small.

There is not any specific restriction on the average particle diameter of a plurality of fine particles constituting the fine particle layer and any size may be used as long as it does not cause the entire thickness of the stacked layer to exceed the value determined according to the application. Preferably, the average particle diameter of a plurality of fine particles constituting the fine particle layer is as small as possible provided that it is large enough to serve as the nucleation site or the growing site of or catalyst for the crystal growth. It is preferable that a fine particle layer of a plurality of fine particles with an average particle diameter (if particles have a non-spherical shape, a sphere-equivalent average particle diameter) of 2 to 50 nm is formed since such an average particle diameter allows well control of the crystal growth in the latter step. It is more preferable that the average particle diameter of the plurality of fine particles is 2 to 10 nm.

The "average particle diameter" herein is obtained from a TEM image. More specifically, the average particle diameter is obtained by observing well-dispersed fine particles with a transmission electron microscope (TEM), measuring the size of each particle in a photographed fine particle image file using an image analysis type particle size distribution measurement software "Mac-View" available from Mountech Co., Ltd, and calculating for randomly selected 50 fine particles.

There is not any specific restriction on the average crystallite diameter of a plurality of fine particles constituting the fine particle layer. Preferably, a fine particle layer with an average crystallite diameter of 2 to 50 nm is formed in step (A) as the fine particle layer. If each fine particle is a single crystal, crystallite diameter=average particle diameter of fine particles, while if each fine particle is a polycrystal body, crystallite diameter<average particle diameter of fine particles.

The "crystallite diameter" herein is calculated by obtaining a full-width at half maximum of the diffraction peak through an XRD analysis and based on the Scherrer equation represented by Formula (a) below. In Formula (a), the following represents the following: D is the crystallite diameter, K is the shape factor, $\lambda$ is the wavelength of X-ray used, $\beta$ is the full-width at half maximum corrected in the broadening of the diffraction peak, and $\theta$ is the diffraction angle. The crystallite diameter is calculated with K=0.9. Correction of the diffraction angle is performed based on the Warren's equation represented by Formula (b) below. Formula (b), the following represents the following: B is the full-width at half maximum of the diffraction peak of a sample and b is the full-width at half maximum of the diffraction peak of a standard sample having a sufficiently large crystallite diameter without lattice distortion. A Si single crystal is used as the standard sample.

$$D=K\lambda/\beta \cos \theta \qquad (a)$$

$$\beta=(B^2-b^2)^{1/2} \qquad (b)$$

In the application of films constituting a photoelectric conversion device, there is not any specific restriction on the relationship in the crystallite diameter between a photoelectric conversion layer and a fine particle layer. The crystallite diameter of the fine particle layer may be larger, smaller, or equal to that of the photoelectric conversion layer.

According to examples of actual measurements conducted by the present inventor, the crystallite diameter of a CIGS photoelectric conversion layer is, for example, 25 to 30 nm while that of a fine particle layer is, for example, 2 to 25 nm. Although not exactly clear, the present inventor believes that the crystallite diameter of the fine particle layer is desirable to be smaller than that of the photoelectric conversion layer.

<Film Forming Step>

There is not any specific restriction on the film forming method of forming the Zn compound layer consisting primarily of Zn(S, O) and/or Zn(S, O, OH) by the liquid phase method, and CBD method or the like is preferably used.

Hereinafter, a preferable composition of the reaction solution will be described. There is not any specific restriction on the component (Z). Preferably, the component (Z) includes at least one kind of compound selected from the group consisting of zinc oxide, zinc acetate, zinc nitrate, and hydrates of these. There is not any specific restriction on the concentration of the component (Z), and 0.001 to 0.5M is preferable.

There is not any specific restriction on the component (S), and it is preferable that the component includes thiourea. There is not any specific restriction on the concentration of the component (S), and 0.01 to 1.0M is preferable.

The component (C) serves as a complex forming agent and selection of appropriate kind and concentration of the component (C) causes complexes to be formed easily. Patent Documents 1 to 7 and Non-patent Document 2 cited under "Description of the Related Art", do not use a citrate compound. Non-patent Document 1 uses a sodium citrate, but the layer formed by CBD is a ZnS layer and not a Zn compound layer consisting primarily of Zn(S, O) and/or Zn(S, O, OH).

Use of the component (C), which is at least one kind of citrate compound, allows complexes to be formed easily without use of an excessive amount of ammonia in compassion with reaction solutions that do not use a citrate compound described in Patent Document 1 to 7 and Non-patent Document 2, whereby crystal growth by CBD reaction is well controlled and a film well covering an underlayer may be formed stably. There is not any specific restriction on the component (C), and it is preferable that the component includes sodium citrate or a hydrate thereof.

The component (N) functions as a complex forming agent, but it also functions as a pH control agent. There is not any specific restriction on ammonium salt which is used favorably as the component (C), and NH$_4$OH and the like are preferably used.

In film forming methods, including the CBD method and the like, in which a thin film is formed directly on a substrate in an aqueous solution, conditions that cause the film forming to preferentially progress without causing sediment are studied, for example, in the following literatures. C. Hubert et al., "A better understanding of the growth mechanism of Zn(S, O, OH) chemical bath deposited buffer layers for high efficiency Cu(In,Ga)(S,Se)$_2$ solar cells", Physics Status Solidi (a), Vol. 205, No. 10, pp. 2335-2339, 2008 (Non-patent Document 3), C. Hubert et al., "Thermodynamic and experimental study of chemical bath deposition of Zn(S,O,OH) buffer layers in basic aqueous ammonia solutions. Cell results with electrodeposited CuIn(S,Se)$_2$ absorbers", Thin Solid Films, Vol. 515, pp. 6032-6035, 2007 (Non-patent Document 4), and B. C. Bunker et al., "Ceramic Thin-Film Formation on Functionalized Interfaces Through Biomimetic Processing", SCIENCE, Vol. 264, No. 5155, pp. 48-55, 1994 (Non-patent Document 5).

As described in these documents, it is known that, when forming a thin film directly on a substrate in an aqueous solution, it is important to perform a reaction under a condition in which heterogeneous nucleation is likely to occur by preventing homogeneous nucleation, i.e., under a comparatively low supersaturation condition. In low supersaturation in which the ratio of the solute concentration in the supersaturated solution to that of a saturated solution is close to one, the heterogeneous nucleation on the external surface occurs preferentially to the homogeneous nucleation in the solution.

Further, in a method, such as the CBD method, in which a thin film is formed directly on a substrate in an aqueous solution, supersaturation control is generally implemented through the use of a complex forming agent (including a secondary complex forming agent). As the supersaturation varies with the solubility of a substance to be deposited, the concentration of the complex forming agent in the reaction solution is controlled according to the reaction temperature and pH of the reaction solution that allow practical reaction speed, whereby the supersaturation of the reaction solution is controlled such that thin film forming is performed preferentially.

As already described, ammonia is used as the complex forming agent in the present invention and Non-patent Documents described above. As for the secondary complex forming agent, trisodium citrate used in the present invention, hydrazine, or the like is used.

Figure 2:
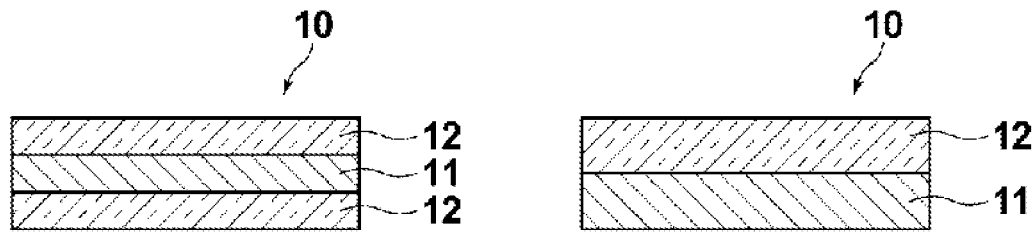
FIG. 2 shows schematic cross-sectional views of two anodized substrates, illustrating the configurations thereof.

Non-patent Document 3 uses only ammonia as the complex forming agent, and with respect to thin films grown in aqueous solutions, including zinc sulfate, ammonia, and thiourea, measurement results of deposition amounts and film thicknesses are shown (FIG. 2, and the like). According to experimental data obtained by changing only the concentration of ammonia (FIG. 2*e*), the film thickness is decreased as the concentration of ammonia is increased to 2.0M, 2.5M, and so on from 1.0M or 1.5M which is appropriate for the growth of a thin film. In the present invention, trisodium citrate is used concurrently, but the similar tendency may be observed if the concentration of the trisodium citrate is maintained constant.

Non-patent document 4 learns the dependency of the solubility of Zn(S, O, OH) on the ammonia concentration and reaction temperature from changes in solubility curves of ZnO, Zn(OH)$_2$, and ZnS (FIG. 2). FIG. 2 shows that the solubility curves change with changes in the ammonia concentration and reaction temperature. In FIG. 2, zinc concentrations in the reaction solution and corresponding pHs are plotted (for example, zinc concentrations of around $10^{-2}$ and corresponding pHs, as the concentration of zinc sulfate is 0.03M in examples) and the difference between a plot and intersection of a straight line drawn parallel to the vertical axis from the plot may be regarded as the supersaturation.

Thus, the relationship between the ammonia concentration and film thickness described in Non-patent Document 3 can be explained by the relationship between the ammonia concentration and supersaturation described in Non-patent Document 4, and by controlling the ammonia concentration so that the supersaturation does not become too high, whereby the heterogeneous nucleation that facilitate thin film growth becomes likely to occur. An excessively high ammonia concentration causes a high solubility and a crystal is not likely to be deposited, while an excessively low ammonia concentration causes the homogeneous nucleation to preferentially progress.

The concentration of sodium citrate in the reaction solution described in Non-patent Document 1 is 0.3M. In the present invention, the concentration of the component (C) is 0.001 to 0.25M. When the concentration of the component (C) lies in the range described above, complexes are formed well and a film well covering an underlayer may be formed stably. A stable aqueous solution in which complexes are well formed may be provided when the concentration of the component (C) exceeds 0.25M but, on the other hand, it causes a slow reaction progress in deposition on the substrate or it may sometimes cause the reaction not to progress at all. Preferably, the concentration of the component (c) is 0.001 to 0.1M.

Non-patent document 1 describes that the ammonia concentration is 0.05 to 0.25M and an optimum concentration is 0.15M. In the present invention, the concentration of the component (N) is 0.041 to 1.0M. The pH may be adjusted by the component (N), whereby the solubility and supersaturation of the metal ions may be controlled.

As the concentration of the component (N) is increased, so does the solubility of metal ions and generation of colloidal particles is prevented. This is due to the fact the spontaneous nucleation becomes unlikely to occur. When the concentration of the component (N) is less than 0.40M, the reaction solution becomes opaque white in a short time from the start of the reaction and colloidal particles become likely to adhere to the substrate. In such a case, it is necessary to take measures, such as replacing the reaction solution frequently, for example, with respect to each or several substrates, resulting in degraded production efficiency. In contrast, present invention allows processing of more substrates with the same reaction solution, resulting in increased production efficiency.

When the concentration of the component (N) is in the range from 0.41 to 1.0M, film forming progress is preferential to homogeneous nucleation. Here, if the deposition is on a substrate having a fine particle layer of a plurality of one kind or two or more kinds of fine particles consisting primarily of at least one kind selected from the group consisting of ZnS, Zn(S, O), and Zn(S, O, OH), the effect is significant. As a result, the generation of colloidal particles in the reaction solution after the start of a reaction is prevented and reaction solution is prevented from becoming opaque white and the film forming may be performed successfully. The advantageous effect of film forming performed on a substrate having a fine particle layer is described, for example, in "Growth conditions for wurtzite zinc oxide films in aqueous solutions, S. Yamabi and H. Imai, "Growth conditions for wurtzite zinc oxide films in aqueous solutions", Journal of Materials Chemistry, Vol. 12, pp. 3773-3778, 2002 (Non-patent Document 6). Preferably, the reaction solution used in the present invention has a transmission factor, measured with a wavelength of 550 nm in a quartz cell having a light path length of 10 mm after being maintained at 90±3° C. for 10 minutes, of 15% or higher, more preferable 20% or higher. The reaction solution of the present invention may satisfy such conditions on the transmission factor.

The pH of the reaction solution before the start of reaction is 9.0 to 12.0. When the reaction solution has a pH less than 9.0 before the start of reaction, the decomposition reaction of the component (S), such as thiourea or the like, does not progress at all or may progress but extremely slowly, so that the deposition reaction does not progress. The decomposition of thiourea is like following, which is described, for example, in J. M. Doña and J. Herrero, "Process and Film Characterization of Chemical-Bath-Deposited ZnS Thin Films", J. Electrochem. Soc., Vol. 141, No. 1, pp. 205-209, 1994, and F. Gode et al., "Investigations on the physical properties of the polycrystalline ZnS thin films deposited by the chemical bath deposition method", Journal of Crystal Growth, Vol. 299, pp. 136-141, 2007.

$$SC(NH_2)_2 + OH^- \Leftrightarrow SH^- + CH_2N_2 + H_2O,$$

$$SH^- + OH^- \Leftrightarrow S^{2-} + H_2O$$

When the reaction solution has a pH exceeding 12.0 before the start of reaction, the influence of the composition (N), which also functions as a complex forming agent, to stabilize the solution becomes large and the deposition reaction does not progress or may progress but extremely slowly. Preferably, the pH of the reaction solution before the start of reaction is 9.5 to 11.5.

The concentration of the component (N) in the reaction solution used in the present invention is 0.41 to 1.0M, which normally causes the pH of the reaction solution before the start of reaction to lie in the range from 9.0 to 12.0 without requiring any particular pH control, such as the use of a pH control agent other than the component (N).

There is not any specific restriction on the pH of the reaction solution after reaction. Preferably, the pH of the reaction solution after reaction is 7.5 to 11.0. When the pH of the reaction solution after reaction is less than 7.5, it implies that there was a time period in which reaction did not progress which is meaningless from the viewpoint of efficient manufacturing. Further, when the pH is reduced in such amount in the system which includes ammonia having buffering effect, it is highly likely that the ammonia is evaporated excessively in a heating process, which may require improvement in the manufacturing process. On the other hand, when the pH of the reaction solution after reaction exceeds 11.0, decomposition of thiourea is accelerated but most of zinc ions are stabilized as ammonium complexes and the progress of deposition reaction may significantly be slowed down. More preferably, the pH of the reaction solution after reaction is 9.5 to 10.5.

In the reaction solution of the present invention, the pH after reaction lies in the range from 7.5 to 11.0 without requiring any particular pH control, such as the use of a pH control agent other than the component (N).

In the present embodiment, the reaction temperature is 70 to 95° C. A reaction temperature below 70° C. causes a reduced reaction speed and a thin film does not grow or may grow but it is difficult to obtain a thin film of desired thickness (e.g., 50 nm or greater) at a practical reaction speed.

On the other hand, a reaction temperature exceeding 95° C. causes many air bubbles to be generated in the reaction solution which may adhere to the surface of the film, whereby the growth of a flat and uniform film is prevented. Further, if the reaction takes place in an open system, a change in the concentration may occur due to evaporation of the solvent, making it difficult to maintain a stable thin film deposition condition. A preferable reaction temperature is 80 to 90° C.

There is not any specific restriction on the reaction time. In the present invention, the concentration of the component (N) is 0.41 to 1.0M. In such a concentration, homogeneous nucleation is prevented and the generation of colloidal particles is prevented since the solubility of metal ions is high. On the other hand, if a film is formed directly on a photoelectric conversion layer by CBD method, the reaction speed is reduced. In the present invention, a fine particle layer is provided in a preceding step, so that the reaction may be performed at a practical reaction speed even the concentration of the component (N) is in the range from 0.41 to 1.0M. Although the reaction time depends on the reaction temperature, a Zn compound layer well covering an underlayer with a thickness sufficient as the buffer layer may be formed, for example, in a reaction time of 10 to 60 minutes.

The reaction solution used in the present invention is an aqueous solution. The pH of the reaction solution is not a strong acid condition. Although the pH of the reaction solution may be 11.0 to 12.0, the reaction may be performed under a moderate pH condition of less than 11.0. The reaction temperature essentially required is not so high. Thus, the reaction of the present invention has less environmental burden and the damage to the substrate is reduced to a minimum.

For example, it is proposed to use an anodized substrate, as the substrate of photoelectric conversion device, such as an anodized substrate formed of an Al-based Al base with an $Al_2O_3$-based anodized film formed on at least one surface side, an anodized substrate formed of a compound base of a Fe-based Fe material and an Al-based Al material attached to at least one surface side of the Fe material with an $Al_2O_3$-based anodized film formed on at least one surface side of the compound base, an anodized substrate formed of a base of a Fe-based Fe material and an Al-based Al film formed on at least one surface side of the Fe material with an $Al_2O_3$-based anodized film formed on at least one surface side of the base, and the like.

The anodized substrates described above do not have high acid or alkali resistance. The present invention may perform reaction under a moderate pH condition, so that, even when such a substrate is used, the invention does not give damage to the substrate and may provide a high quality photoelectric conversion device.

According to the present invention, a method of manufacturing a Zn system buffer layer well covering an underlayer by preventing adhesion of colloidal particles is provided.

[Buffer Layer]

The buffer layer of the present invention is a layer manufactured by the buffer layer manufacturing method of the present invention.

[Reaction Solution]

The reaction solution itself used in the manufacturing method of the present invention is novel and is included in the present invention.

The reaction solution of the present invention is a solution for use in manufacturing a Zn compound layer consisting primarily of Zn(S, O) and/or Zn(S, O, OH) included in a buffer layer of a photoelectric conversion device having a stacked structure in which a lower electrode, a photoelectric conversion semiconductor layer that generates a current by absorbing light, a buffer layer that includes the Zn compound layer, a translucent conductive layer, and an upper electrode are stacked on a substrate, the solution including:

a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:

the concentration of the component (C) is 0.001 to 0.25M;

the concentration of the component (N) is 0.41 to 1.0M; and the pH before the start of reaction is 9.0 to 12.0.

Preferably, the reaction solution of the present invention includes, as the component (Z), at least one kind selected from the group consisting of zinc sulfate, zinc acetate, zinc nitrate, and hydrates thereof. Preferably, the reaction solution of the present invention includes thiourea as the component (S). Preferably, the reaction solution of the present invention includes sodium citrate and/or a hydrate thereof as the component (C). Preferably, the pH of the reaction solution of the present invention after reaction is 7.5 to 11.0.

Preferably, the reaction solution of the present invention is a solution prepared by a reaction solution preparation method which includes an aqueous solution preparation step for preparing an aqueous solution (I) which includes the component (Z), an aqueous solution (II) which includes the component (S), an aqueous solution (III) which includes the component (C), and an aqueous solution (IV) which includes the component (N) separately, and an aqueous solution mixing step for mixing the aqueous solutions (I) to (IV), in which the aqueous solution (IV) among the aqueous solutions (I) to (IV) is added last in the aqueous solution mixing step.

In the aqueous solution mixing step, if the aqueous solution (IV) among the aqueous solutions (I) to (IV) is not added last, the reaction solution may sometimes become opaque white during manufacturing. In the aqueous solution mixing step, the addition of the aqueous solution (IV) last among the aqueous solutions (I) to (IV) may stably prevent the reaction solution from becoming opaque white. This is due to the fact that, when a citrate compound and zinc ions coexist, the solution is stabilized by the formation of a zinc citrate complex and the solubility of the system is increased, so that sediment is unlikely to be deposited (sediment formation due to homogeneous nucleation) even if ammonia is added.

The present invention may provide a reaction solution in which colloidal particle generation is suppressed as long as possible and the solution is prevented from becoming opaque white, thereby allowing a Zn system buffer layer well covering an underlayer to be formed.

The present invention may provide a reaction solution having a transmission factor of 15% or higher measured with a wavelength of 550 nm in a quartz cell having a light path length of 10 mm after being maintained at 90±3° C. for 10 minutes.

[Photoelectric Conversion Device]

A photoelectric conversion device of the present invention is a device having a stacked structure in which a lower electrode (back contact electrode), a photoelectric conversion semiconductor layer that generates a current by absorbing light, a buffer layer, a translucent conductive layer (transparent electrode), and an upper electrode (grid electrode) are stacked on a substrate, in which the buffer layer is manufactured by the buffer layer manufacturing method of the present invention described above.

There is not any specific restriction on the substrate, and the following may be cited: a glass substrate, a metal substrate, such as stainless substrate, on which an insulating layer is formed, an anodized substrate formed of an Al-based Al base with an $Al_2O_3$-based anodized film formed on at least one surface side, an anodized substrate formed of a compound base of a Fe-based Fe material and an Al-based Al material attached to at least one surface side of the Fe material with an $Al_2O_3$-based anodized film formed on at least one surface side of the compound base, an anodized substrate formed of a base of a Fe-based Fe material and an Al-based Al film formed on at least one surface side of the Fe material with an $Al_2O_3$-based anodized film formed on at least one surface side of the base, and a resin substrate, such as polyimide substrate.

Flexible substrates, such as a metal substrate on which an insulating film is formed, an anodized substrate, a resin substrate, and like, are preferably used as they can be manufactured by a roll-to-roll process (continuous process).

In view of the thermal expansion coefficient, heat resistance, and insulating property of the substrate, an anodized substrate selected from the group consisting of an anodized substrate formed of an Al-based Al base with an $Al_2O_3$-based anodized film formed on at least one surface side, an anodized substrate formed of a compound base of a Fe-based Fe material and an Al-based Al material attached to at least one surface side of the Fe material with an $Al_2O_3$-based anodized film formed on at least one surface side of the compound base, and an anodized substrate formed of a base of a Fe-based Fe material and an Al-based Al film formed on at least one surface side of the Fe material with an $Al_2O_3$-based anodized film formed on at least one surface side of the base is particularly preferable.

[Photoelectric Conversion Device]

Figure 3:
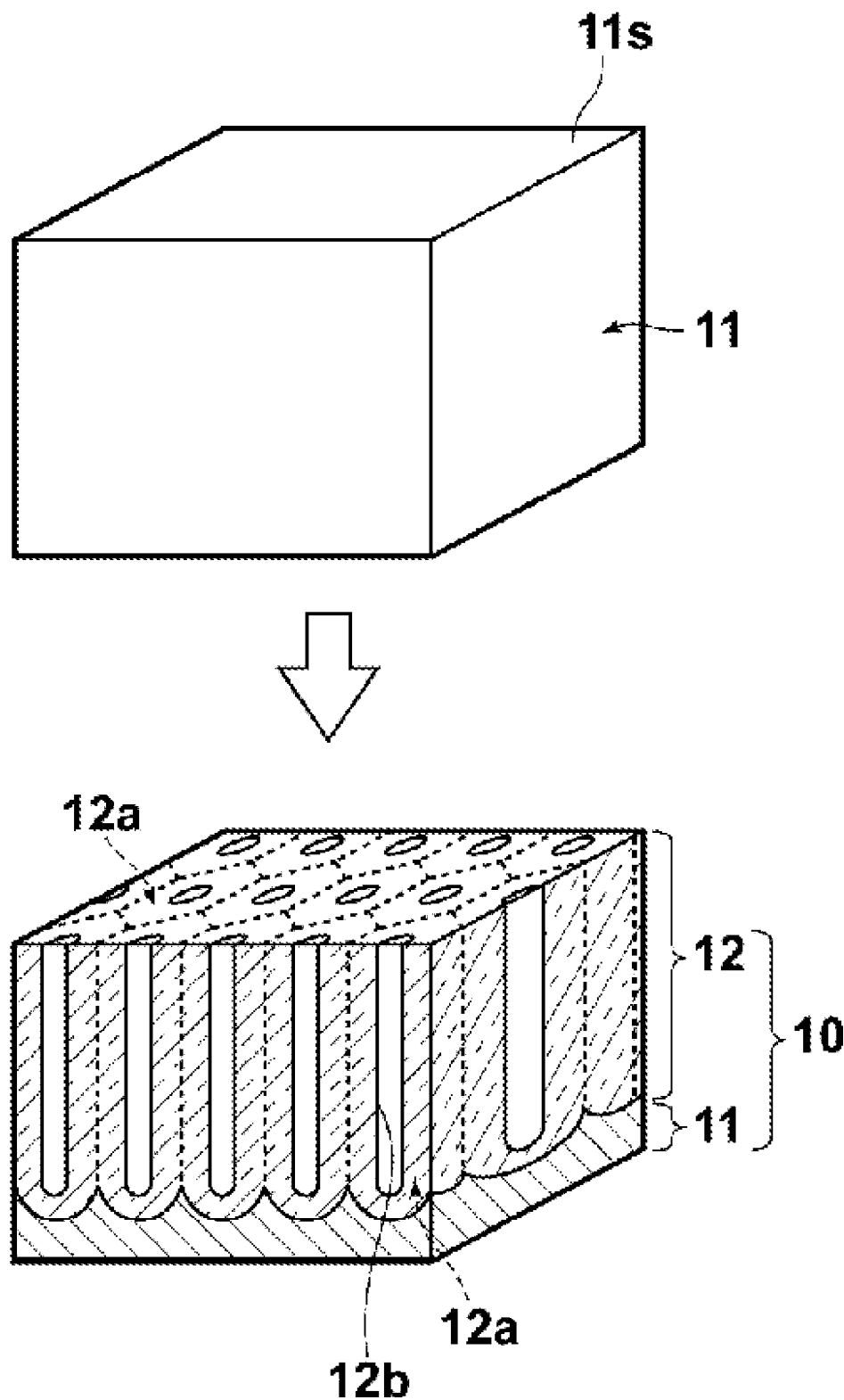
FIG. 3 is a perspective view illustrating a method of manufacturing an anodized substrate.

A structure of a photoelectric conversion device according to an embodiment of the present invention will be described with reference to the accompanying drawings. FIG. 1 is a schematic cross-sectional view of the photoelectric conversion device. FIG. 2 shows schematic cross-sectional views of two substrates, illustrating the configurations thereof, and FIG. 3 is a perspective view of an anodized substrate, illustrating a manufacturing method thereof. In the drawings, each component is not drawn to scale in order to facilitate visual recognition.

Photoelectric conversion device 1 is a device having substrate on which lower electrode (back contact electrode) 20, photoelectric conversion layer 30, buffer layer 40, window layer 50, translucent conductive layer (transparent electrode) 60, and upper electrode (grid electrode) 70 are stacked in this order.

(Substrate)

In the present embodiment, substrate 10 is an anodized substrate obtained by anodizing at least one of the sides of Al-based Al base 11. Substrate 10 may be Al base 11 with anodized film 12 formed on each side, as illustrated on the left of FIG. 2 or Al base 11 with anodized film 12 formed on either one of the sides, as illustrated on the right of FIG. 2. Anodized film 12 is a film mainly consisting of $Al_2O_3$.

Preferably, substrate 10 is a substrate of Al base 11 with anodized film 12 formed on each side as illustrated on the left of FIG. 3 in order to prevent warpage of the substrate due to the difference in thermal expansion coefficient between Al and $Al_2O_3$, and detachment of the film due to the warpage during the device manufacturing process.

Anodization may be performed by dipping Al base 11, which is cleaned, smoothed by polishing, and the like as required, as an anode together with a cathode in an electrolyte, and applying a voltage between the anode and cathode. As for the cathode, carbon, aluminum, or the like is used. There is not any specific restriction on the electrolyte, and an acid electrolyte that includes one kind or two or more kinds of acids, such as sulfuric acid, phosphoric acid, chromic acid, oxalic acid, sulfamic acid, benzenesulfonic acid, amido-sulfonic acid, and the like, is preferably used.

There is not any specific restriction on the anodizing conditions, which are dependent on the electrolyte used. As for the anodizing conditions, for example, the following are appropriate: an electrolyte concentration of 1 to 80% by mass; a solution temperature of 5 to 70° C.; a current density of 0.005 to 0.60 $A/cm^2$; a voltage of 1 to 200 V; and an electrolyzing time of 3 to 500 minutes.

As for the electrolyte, a sulfuric acid, a phosphoric acid, an oxalic acid, or a mixture thereof may preferably be used. When such an electrolyte is used, the following conditions are preferable: an electrolyte concentration of 4 to 30% by mass, a solution temperature of 10 to 30° C., a current density of 0.05 to 0.30 A/cm², and a voltage of 30 to 150 V.

As shown in FIG. 3, when Al-based Al base 11 is anodized, an oxidization reaction proceeds from surface 11s in a direction substantially perpendicular to surface 11s, and $Al_2O_3$-based anodized film 12 is formed. Anodized film 12 generated by the anodization has a structure in which multiple fine columnar bodies, each having a substantially regular hexagonal shape in plan view, are tightly arranged. Each fine columnar body 12a has a fine pore 12b, substantially in the center, extending substantially linearly in a depth direction from surface 11s, and the bottom surface of each fine columnar body 12a has a rounded shape. Normally, a barrier layer without any fine pore 12b is formed at a bottom area of fine columnar bodies 12a. Anodized film 12 without fine pores 12b may be formed using appropriate anodization conditions.

There is not any specific restriction on the thicknesses of Al base 11 and anodized film 12. In view of the mechanical strength of substrate 10 and the trend toward thinness and lightness of the device, the thickness of Al base 11 prior to anodization is, for example, 0.05 to 0.6 mm, and more preferably 0.1 to 0.3 mm. When insulation properties, mechanical strength, and the trend toward thinness and lightness are taken into account, a preferable thickness range of anodized film 12 is 0.1 to 100 µm.

(Lower Electrode)

There is not any specific restriction on the major component of lower electrode (back contact electrode) 20 and Mo, Cr, W, or a combination thereof is preferably used, in which Mo is particularly preferable. There is not any specific restriction on the thickness of lower electrode (back contact electrode) 20 and 200 to 1000 nm is preferable.

(Photoelectric Conversion Layer)

There is not any specific restriction on the major component of photoelectric conversion layer 30. Since high photoelectric conversion efficiency can be obtained, it is preferable that the major component of photoelectric conversion layer 30 is at least one kind of compound semiconductor having a chalcopyrite structure, and more preferably the compound semiconductor is a semiconductor formed of a group Ib element, a group IIIb element, and a group VIb element.

Preferably, the group Ib element is at least one kind of element selected from the group consisting of Cu and Ag, the group IIIb element is at least one kind of element selected from the group consisting of Al, Ga, and In, and the group VIb element is at least one kind of element selected from the group consisting of S, Se, and Te.

Such compound semiconductors described above include $CuAlS_2$, $CuGaS_2$, $CuInS_2$, $CuAlSe_2$, $CuGaSe_2$, $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu (In, Al) Se_2$, $Cu (In, Ga) (S, Se)_2$, $Cu_{1-z}In_{1-x}Ga_xSe_{2-y}S_y$ (where, $0 \leq x \leq 1$, $0 \leq y \leq 2$, $0 \leq z \leq 1$) (CI(G)S), $Ag(In, Ga) Se_2$, $Ag (In, Ga) (S, Se)_2$, and the like.

There is not any specific restriction on the film thickness of photoelectric conversion layer 30, and 1.0 to 3.0 µm is preferable and 1.5 to 2.0 µm is more preferable.

(Buffer Layer)

Buffer layer 40 is provided for (1) prevention of recombination of photogenerated carriers (2) band discontinuity alignment (3) lattice matching (4) coverage of surface unevenness of the photoelectric conversion layer, and the like.

In the present embodiment, buffer layer 40 is a film manufactured by the buffer layer manufacturing method of the present invention described above and has a stacked structure of fine particle layer 41 of a plurality of one kind or two or more kinds of fine particles consisting primarily of at least one kind selected from the group consisting of ZnS, Zn(S, O), and Zn(S, O, OH), and Zn compound layer 42 consisting primarily of Zn(S, O) and/or Zn(S, O, OH) formed by a liquid phase method.

There is not any specific restriction on the conductivity type of buffer layer 40 and n-type or the like is preferable. There is not any specific restriction on the film thickness of buffer layer 40, in which 10 nm to 2 µm is preferable and 15 to 200 nm is more preferable.

(Window Layer)

Window layer 50 is an intermediate layer for introducing light. There is not any specific restriction on the composition of window layer 50, and i-ZnO or the like is preferable. There is not any specific restriction on the film thickness of window layer 50, in which 10 nm to 2 µm is preferable and 15 to 200 nm is more preferable. Window layer 50 is not essential and some of the photoelectric conversion devices do not have window layer 50.

(Translucent Conductive Layer)

Translucent conductive layer (transparent electrode) 60 functions as a layer for introducing light and allowing a current generated in photoelectric conversion layer 30 to flow therethrough with lower electrode 20 as a pair. There is not any specific restriction on the composition of translucent conductive layer 60, and n-ZnO, such as ZnO:Al, or the like is preferable. There is not any specific restriction on the film thickness of translucent conductive layer 60, and 50 nm to 2 µm is preferable.

(Upper Electrode)

There is not any specific restriction on the major component of upper electrode (grid electrode) 70, and Al or the like is preferably used. There is not any specific restriction on the film thickness of upper electrode 70, and 0.1 to 3 µm is preferable.

Photoelectric conversion device 1 of the present embodiment is structured in the manner as described above. Photoelectric conversion device 1 can be favorably used for solar cell applications and the like. It can be turned into a solar cell by attaching, as required, a cover glass, a protection film, and the like. The present invention is not limited to the embodiment described above, and design changes may be made as appropriate without departing from the sprit of the invention.

EXAMPLES

Examples and comparative examples will now be described.

<Preparation of Reaction Solutions 1 to 22>

Component (Z), component (S), component (C), component (N), NaOH, and water were mixed in ratios shown in Tables 1 to 3 to prepare reaction solutions 1 to 22. For reaction solutions other than Reaction Solutions 10 and 19, an aqueous solution (I) of the component (Z), an aqueous solution (II) of the component (S), an aqueous solution (III) of the component (C), and an aqueous solution (IV) of the component (N) were prepared separately and then mixed together. When mixing the aqueous solutions (I) to (IV), the aqueous solution (IV) was added last.

For Reaction Solution 10, NaOH was further added after mixing the aqueous solutions (I) to (IV). For Reaction Solution 19, the mixing order was changed in which the aqueous solution (I), aqueous solution (II), and aqueous solution (IV) were mixed first and the aqueous solution (III) was added last. When the aqueous solution (I), aqueous solution (II), and aqueous solution (IV) were mixed, the mixed solution became opaque white, but the aqueous solution (III) was added thereto without regarding the white opaque phenomenon.

The tables include a pH of each reaction solution before the start of reaction. Further, a condition outside of the present invention is denoted by a "x" mark in the tables. Reaction Solution 18 uses zinc citrate as the component (Z). Here, the zinc citrate doubles as the component (C).

Examples 1 to 7, Comparative Examples 1 to 10

[Substrate]

A Mo lower electrode was formed on a soda-lime glass (SLG) substrate of 30 mm×30 mm with a thickness of 0.8 μm by sputtering. Then, a $Cu(In_{0.7}Ga_{0.3})Se_2$ layer was formed on the substrate with a thickness of 1.8 μm by three-stage process which is known as one of the film forming methods for CIGS layers.

<Fine Particle Layer Forming Step>

For Examples 1 to 7 and Comparative Examples 1, 6, 8, and 10, a fine particle layer was formed on a CIGS layer in the following manner. Reaction Solution 2 was put in a Teflon® vessel with a stirrer bar and heated to 90° C. An opaque white colloidal solution (particle dispersed solution) was obtained 60 minutes after the start of heating. Then, the solution was subjected to centrifugation. Fine particles obtained were sufficiently cleaned with purified water. The fine particles obtained were dispersed in water to obtain aqueous dispersion. The solid content was 5% by mass. Particles obtained were dried and subjected to XRD and EDX analyses which showed that the particles were Zn(S, O). The aqueous dispersion of fine particles obtained was applied to each substrate on which a CIGS layer was formed by a spin coating method (revolution: 1000 rpm, rotation time: 30 sec.) and the substrate was dried at room temperature, whereby a Zn(S, O) fine particle layer was formed.

<Film Forming Step>

A Zn compound layer consisting primarily of Zn(S, O) and/or Zn(S, O, OH) was formed on the fine particle layer for Examples 1 to 7 and Comparative Examples 1, 6, 8, and 10, and on the CIGS layer for the other comparative examples by the CBD method using one of Reaction Solutions 1 to 22. More specifically, the buffer layer was formed by dipping each substrate with the CIGS layer formed thereon in each 500 ml reaction solution which is temperature controlled at a predetermined value for a predetermined time, then picking up the substrate from the reaction solution, and drying the substrate at room temperature. When dipping each substrate in each reaction solution, the substrate was placed such that the surface thereof is perpendicular to the bottom of the reaction solution vessel.

The kind of reaction solution, appearance of the reaction solution before the start of reaction, reaction temperature, reaction time, and pHs before and after reaction in each example are shown in Tables 4 to 6. A condition outside of the present invention is denoted by a "x" mark in the tables.

<Evaluation 1 (Transmission Factor of 10 Minutes after 90±3° C.)>

Each reaction solution was put in a quartz cell having a light path length of 10 mm after being maintained at 90±3° C. for 10 minutes, and the transmission factor thereof at a wavelength of 550 nm was measured and evaluated based on the criteria shown below. In the evaluation, it took about 30 minutes to raise the temperature of each sample to 90±3° C. after start of the heating. The evaluation was performed by maintaining the temperature of each sample at 90±3° C. for 10 minutes from the time when the temperature reached 90±3° C. (about 30 minutes after start of the heating).

○: Having a transmission factor of 15% or more.

x: Having a transmission factor of less than 15%.

<Evaluation 2 (Transmission Factor of 30 Minutes after 90±3° C.)>

Each reaction solution was put in a quartz cell having a light path length of 10 mm after being maintained at 90±3° C. for 30 minutes, and the transmission factor thereof at a wavelength of 550 nm was measured and evaluated based on the criteria shown below. In the evaluation, it took about 30 minutes to raise the temperature of each sample to 90±3° C. after the start of heating. The evaluation was performed by maintaining the temperature of each sample at 90±3° C. for 30 minutes from the time when the temperature reached 90±3° C. (about 30 minutes after the start of heating).

[Evaluation Criteria]

○: Having a transmission factor of 15% or higher.

x: Having a transmission factor of less than 15%.

<Evaluation 3 (Film Coverage Over Glass Substrate)>

In each example, a buffer layer consisting primarily of Zn(S, O) and/or Zn(S, O, OH) was formed by CBD method using a glass substrate under the same condition. The transmission factor of each substrate having a thin film formed thereon was measured with a wavelength of 550 nm with a glass substrate not having a thin film as a reference and an evaluation was conducted based on the criteria shown below. A low transmission factor of a substrate having a thin film formed thereon signifies that the glass substrate was well covered by the thin film.

[Evaluation Criteria]

○: not greater than 87%, Δ: over 87% to 92%, x: over 92%

<Evaluation 4 (Film Coverage Over CIGS Layer)>

A SEM observation was performed on each CIGS substrate having a buffer layer formed thereon and an evaluation was conducted based on the criteria shown below.

[Evaluation Criteria]

○: A buffer layer completely covering the CIGS underlayer was formed.

x: A portion of the CIGS underlayer was exposed.

<Evaluation 5 (Colloidal Particle Adhesion)>

After each film was formed by the CBD method, a SEM observation was performed on the surface of the film and the rear surface of the substrate to count the number of adhered colloidal particles per 1 μm×1 μm. The counting was performed, in each example, on 10 field images and the average value was evaluated based on the criteria shown below. Note that evaluation 5 was not performed on the examples not covering well the glass substrate or CIGS substrate in Evaluation 3 or 4, because the film forming itself is not satisfactory.

[Evaluation Criteria]

○: Average number of adhered colloidal particles is less than 5.

x: Average number of adhered colloidal particles is 5 or more.

<Evaluation Results for Evaluations 1 to 5>

Reaction Solutions 5, 6, 7, 8, 20, and 22 that satisfy the conditions of the present invention were prevented from becoming opaque white even when they were maintained at 90±3° C., and the transmission factor at 550 nm after being maintained at 90±3° C. for 10 minutes was 15.0% or higher and was also 15.0% or higher after being maintained at 90±3° C. for 30 minutes. In particular, a high transmission factor was obtained for Reaction Solutions 7, 8, and 20.

Each of Examples 1 to 7, in which a Zn compound layer was formed by the CBD method using one of the reaction solutions described above after forming a particle layer, could provide a buffer layer well covering an underlayer. The average number of adhered colloidal particles per 1 μm×1 μm on the surface of the formed film and the rear surface of the substrate was less than 5, demonstrating that a high quality buffer layer was formed.

In Comparative Examples 3 to 5 and 7 in which a fine particle layer was not formed in advance, the reaction speed was slow even when any one of Reaction Solutions 6, 7, 8, and 20 was used, so that a buffer layer well covering an underlayer could not be formed.

Reaction Solution 1 was prevented from becoming opaque white even when it was maintained at 90±3° C. and the transmission factor at 550 nm after being maintained at 90±3° C. for 10 minutes was 15.0% or higher and was also 15.0% or higher after being maintained at 90±3° C. for 30 minutes. In Comparative Example 1 that used Reaction Solution 1 having a pH of less than 9.0, a buffer layer well covering an underlayer could not be formed.

Reaction Solution 2 having a component (N) concentration of 0.40M became opaque white immediately after it was maintained at 90±3° C. and the transmission factor thereof at 550 nm after being maintained at 90±3° C. for 10 minutes was reduced to less than 15%. In Comparative Example 2 that used Reaction Solution 2 allowed a buffer layer well covering an underlayer to be formed but a large number of adhered colloidal particles was observed.

Reaction Solutions 9 and 21 were prevented from becoming opaque white even when they were maintained at 90±3° C. and the transmission factor at 550 nm after being maintained at 90±3° C. for 10 minutes was 15.0% or higher and was also 15.0% or higher after being maintained at 90±3° C. for 30 minutes. In Comparative Examples 6 and 8 that used Reaction Solution 9 having a component (N) concentration of over 1.0M and Reaction Solution 21 having a component (C) concentration of over 0.25M respectively, however, a buffer layer well covering an underlayer could not be formed even though a fine particle layer was formed in advance.

Reaction solution 19 having a component (N) concentration of not greater than 0.40M and the mixing order when preparing the reaction solution was changed became opaque white and sediment was observed at the time of the preparation. In Comparative Example 9 that used Reaction Solution 19 and without a fine particle layer, a buffer layer well covering an underlayer could not be formed.

Reaction solution 10 having no component (N) and a pH of over 12.0 became opaque white and sediment was observed at the time of the preparation. In Comparative Example 10 that used Reaction Solution 10, a buffer layer well covering an underlayer could not be formed.

Reaction Solutions 3, 4, 10 to 18 having a component (N) concentration of not greater than 0.40M became opaque white immediately after they were maintained at 90±3° C. and the transmission factor thereof at 550 nm after being maintained at 90±3° C. for 10 minutes was reduced to less than 15%.

<Evaluation 6>

Figure 4A:
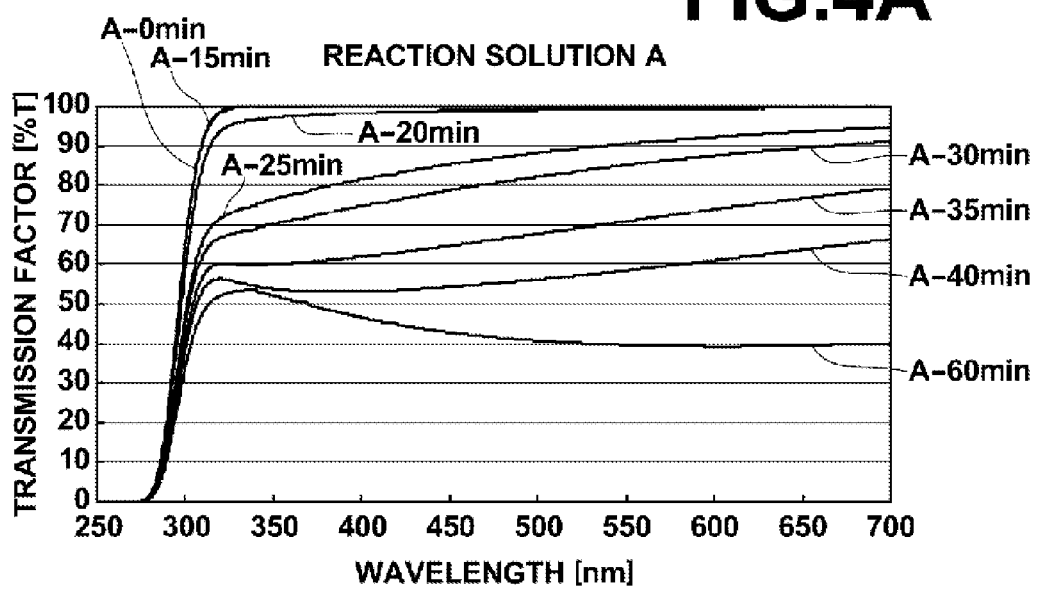
FIG. 4A is a graph illustrating a temporal change in the transmission spectrum of Reaction Solution 7 (Reaction Solution A).
Figure 4B:
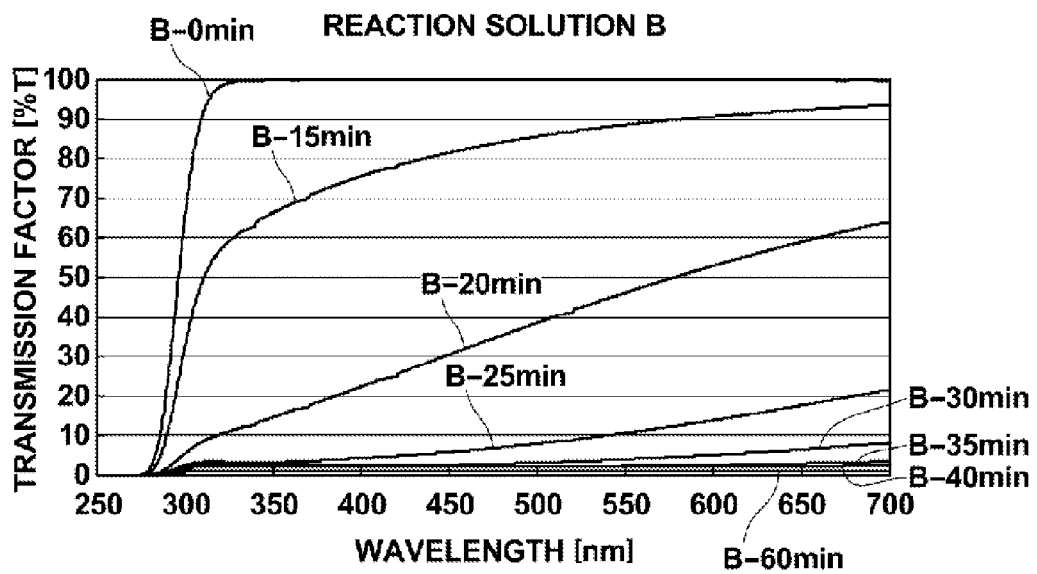
FIG. 4B is a graph illustrating a temporal change in the transmission spectrum of Reaction Solution 2 (Reaction Solution B).
Figure 4C:
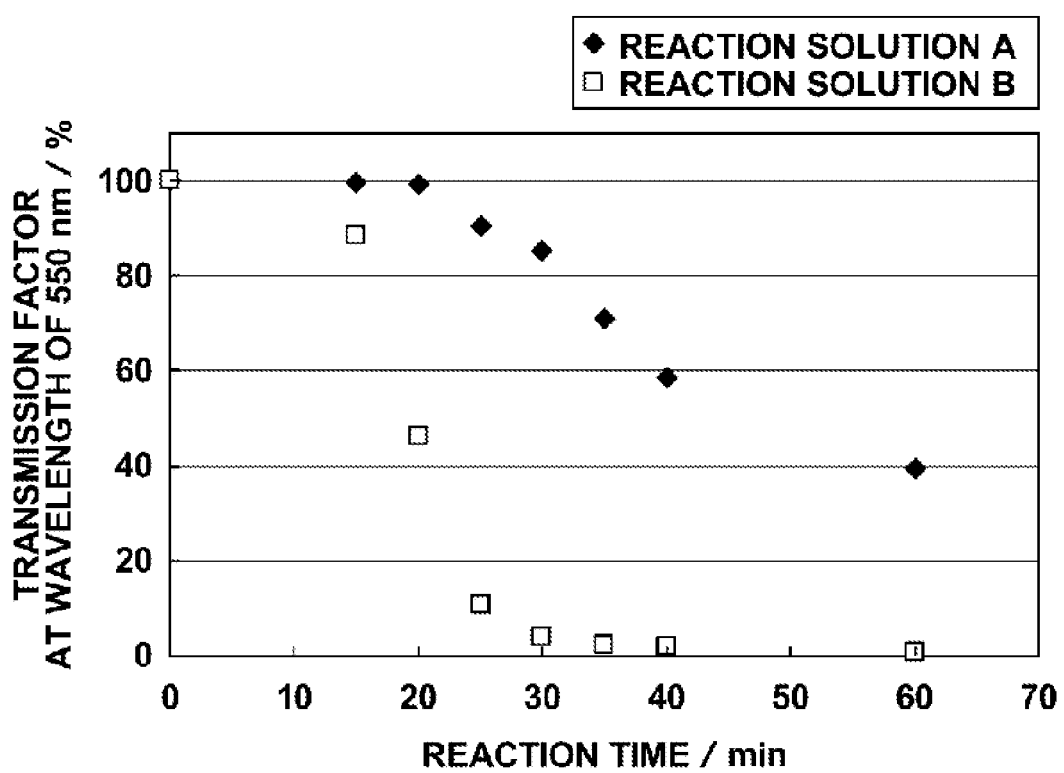
FIG. 4C is a graph illustrating temporal changes in the transmission spectra of Reaction Solution 7 (Reaction Solution A) and Reaction Solution 2 (Reaction Solution B).

With respect to Reaction Solution 7 that satisfies the conditions of the present invention and Reaction Solution 2 that does not satisfy the conditions of the present invention, variations in transmission spectra when the reaction solutions were maintained at 90±3° C. were measured by the same measuring method as that of Evaluations 1 and 2. In the evaluation, it took abut 30 minutes to raise the temperature of each sample to 90±3° C. after start of the heating. A time when the temperature reached 90±3° C. (about 30 minutes after start of the heating) was regarded as the start point of temperature retention, and a variation in each transmission spectrum with respect to the retention time at 90±3° C. from the start point was measured. The results are shown in FIGS. 4A to 4C. In the drawings, Reaction Solution 7 is indicated as Reaction Solution A and Reaction Solution 2 is indicated as Reaction Solution B. In FIGS. 4A to 4C, the heating time is indicated with the heating start time as zero. Thus, the start point of temperature retention is about 30 minutes after start of the heating in these graphs.

Reaction Solution (Reaction Solution A) is prevented from becoming opaque white even maintained at 90±3° C. and the transmission factor thereof at 550 nm after being maintained at 90±3° C. for 10 minutes was 58.5% and the transmission factor after being maintained at 90±3° C. for 30 minutes was 39.6%, indicating satisfactory results. In contrast, Reaction Solution 2 (Reaction Solution B) became opaque white immediately after being maintained at 90±3° C. and the transmission factor thereof at 550 nm after being maintained at 90±3° C. for 10 minutes is reduced to 2.1% and the transmission factor after being maintained at 90±3° C. for 30 minutes is reduced to 1.0%.

TABLE 1

|  | Reaction Solution 1 | Reaction Solution 2 | Reaction Solution 3 | Reaction Solution 4 | Reaction Solution 5 | Reaction Solution 6 | Reaction Solution 7 |
|---|---|---|---|---|---|---|---|
| (Z) | Zinc Sulfate | Zinc Sulfate | Zinc Sulfate | Zinc Sulfate | Zinc Sulfate | Zinc Sulfate | Zinc Sulfate |
| (Z) concentration[M] | 0.03 | 0.03 | 0.03 | 0.03 | 0.03 | 0.03 | 0.03 |
| (S) | Thiourea | Thiourea | Thiourea | Thiourea | Thiourea | Thiourea | Thiourea |
| (S) concentration[M] | 0.05 | 0.05 | 0.05 | 0.05 | 0.05 | 0.05 | 0.05 |
| (C) | Sodium Citrate | Sodium Citrate | Sodium Citrate | Sodium Citrate | Sodium Citrate | Sodium Citrate | Sodium Citrate |
| (C) concentration[M] | 0.03 | 0.03 | 0.03 | 0.03 | 0.03 | 0.03 | 0.03 |
| (N) | $NH_4OH$ | $NH_4OH$ | $NH_4OH$ | $NH_4OH$ | $NH_4OH$ | $NH_4OH$ | $NH_4OH$ |
| (N) concentration[M] | 0.00 X | 0.15 X | 0.30 X | 0.40 X | 0.45 | 0.60 | 0.75 |
| NaOH concentration[M] | — | — | — | — | — | — | — |
| pH(Before Start of Reaction) | 6.2 | 10.3 | 10.5 | 10.6 | 10.8 | 10.9 | 11.0 |

TABLE 2

|  | Reaction Solution 8 | Reaction Solution 9 | Reaction Solution 10 | Reaction Solution 11 | Reaction Solution 12 | Reaction Solution 13 | Reaction Solution 14 |
| --- | --- | --- | --- | --- | --- | --- | --- |
| (Z) | Zinc Sulfate | Zinc Sulfate | Zinc Sulfate | Zinc Sulfate | Zinc Sulfate | Zinc Sulfate | Zinc Sulfate |
| (Z) concentration[M] | 0.03 | 0.03 | 0.03 | 0.03 | 0.03 | 0.03 | 0.03 |
| (S) | Thiourea | Thiourea | Thiourea | Thiourea | Thiourea | Thiourea | Thiourea |
| (S) concentration[M] | 0.05 | 0.05 | 0.05 | 0.05 | 0.05 | 0.05 | 0.05 |
| (C) | Sodium Citrate | Sodium Citrate | Sodium Citrate | Sodium Citrate | Sodium Citrate | Sodium Citrate | Sodium Citrate |
| (C) concentration[M] | 0.03 | 0.03 | 0.03 | 0.045 | 0.06 | 0.15 | 0.225 |
| (N) | $NH_4OH$ | $NH_4OH$ | $NH_4OH$ | $NH_4OH$ | $NH_4OH$ | $NH_4OH$ | $NH_4OH$ |
| (N) concentration[M] | 0.90 | 1.20 X | 0.00 X | 0.15 X | 0.15 X | 0.15 X | 0.15 X |
| NaOH concentration[M] | — | — | 0.15 | — | — | — | — |
| pH(Before Start of Reaction) | 11.1 | 11.3 | 13.3 X | 10.4 | 10.4 | 10.5 | 10.5 |

TABLE 3

|  | Reaction Solution 15 | Reaction Solution 16 | Reaction Solution 17 | Reaction Solution 18 | Reaction Solution 19 | Reaction Solution 20 | Reaction Solution 21 | Reaction Solution 22 |
| --- | --- | --- | --- | --- | --- | --- | --- | --- |
| (Z) | Zinc Sulfate | Zinc Acetate | Zinc Nitrate | Zinc Citrate | Zinc Sulfate | Zinc Sulfate | Zinc Sulfate | Zinc Sulfate |
| (Z) concentration[M] | 0.03 | 0.03 | 0.03 | 0.03 | 0.03 | 0.03 | 0.03 | 0.03 |
| (S) | Thiourea | Thiourea | Thiourea | Thiourea | Thiourea | Thiourea | Thiourea | Thiourea |
| (S) concentration[M] | 0.05 | 0.05 | 0.05 | 0.05 | 0.05 | 0.05 | 0.05 | 0.05 |
| (C) | Sodium Citrate | Sodium Citrate | Sodium Citrate | Zinc Citrate | Sodium Citrate | Sodium Citrate | Sodium Citrate | Sodium Citrate |
| (C) concentration[M] | 0.30 X | 0.03 | 0.03 | 0.03 | 0.03 | 0.225 | 0.30 X | 0.01 |
| (N) | $NH_4OH$ | $NH_4OH$ | $NH_4OH$ | $NH_4OH$ | $NH_4OH$ | $NH_4OH$ | $NH_4OH$ | $NH_4OH$ |
| (N) concentration[M] | 0.15 X | 0.15 X | 0.15 X | 0.15 X | 0.15 X | 0.75 | 0.75 | 0.75 |
| NaOH concentration[M] | — | — | — | — | — | — | — | — |
| pH(Before Start of Reaction) | 10.6 | 10.5 | 10.6 | 9.1 | 9.6 | 11.2 | 11.3 | 11.0 |

TABLE 4

|  | Example Evaluation 1 | Example Evaluation 2 | Example Evaluation 3 | Example Evaluation 4 | Example Evaluation 5 | Example Evaluation 6 | Example Evaluation 7 |
| --- | --- | --- | --- | --- | --- | --- | --- |
| Substrate | CIGS/Mo/SLG | CIGS/Mo/SLG | CIGS/Mo/SLG | CIGS/Mo/SLG | CIGS/Mo/SLG | CIGS/Mo/SLG | CIGS/Mo/SLG |
| W/WO Fine Particle Layer | With | With | With | With | With | With | With |
| Fine Particle Layer Forming Method | Spin Coating | Spin Coating | Spin Coating | Spin Coating | Spin Coating | Spin Coating | Spin Coating |
| Reaction Solution | Reaction Solution 6 | Reaction Solution 7 | Reaction Solution 8 | Reaction Solution 20 | Reaction Solution 5 | Reaction Solution 6 | Reaction Solution 22 |
| Appearance of Reaction Solution (Before Start of Reaction) | Transparent | Transparent | Transparent | Transparent | Transparent | Transparent | Transparent |
| pH (Before Start of Reaction) | 10.9 | 11.0 | 11.1 | 11.2 | 10.8 | 10.9 | 11 |
| Reaction Temperature | 90° C. | 90° C. | 90° C. | 90° C. | 90° C. | 75° C. | 90° C. |
| Reaction Time | 60 min | 60 min | 60 min | 60 min | 60 min | 180 min | 60 min |
| pH (After Reaction) | 10.9 | 10.9 | 11.0 | 11.2 | 10.8 | 10.9 | 10.8 |
| Evaluation 1: Reaction Solution Transmission Factor 10 Minutes after 90° C. | 51.3 ○ | 58.5 ○ | 62.6 ○ | 60.2 ○ | ○ | 51.3 ○ | 56.9 ○ |
| Evaluation 2: Reaction Solution Transmission Factor 30 Minutes after 90° C. | 37.1 ○ | 39.6 ○ | 45.1 ○ | 42.3 ○ | ○ | 37.1 ○ | 38.4 ○ |
| Evaluation 3: Film Coverage over Glass Substrate | ○ | ○ | ○ | ○ | ○ | ○ | ○ |
| Evaluation 4: Film Coverage over CIGS Layer | ○ | ○ | ○ | ○ | ○ | ○ | ○ |
| Evaluation 5: Colloid Particle Adhesion | ○ | ○ | ○ | ○ | ○ | ○ | ○ |

TABLE 5

|  | Comparative Example 1 | Comparative Example 2 | Comparative Example 3 | Comparative Example 4 | Comparative Example 5 |
| --- | --- | --- | --- | --- | --- |
| Substrate | CIGS/Mo/SLG | CIGS/Mo/SLG | CIGS/Mo/SLG | CIGS/Mo/SLG | CIGS/Mo/SLG |
| W/WO Fine Particle Layer | With | Without X | Without X | Without X | Without X |
| Fine Particle Layer Forming Method | Spin Coating | — | — | — | — |
| Reaction Solution | Reaction Solution 1 X | Reaction Solution 2 X | Reaction Solution 6 | Reaction Solution 7 | Reaction Solution 8 |
| Appearance of Reaction Solution (Before Start of Reaction) | Transparent | Transparent | Transparent | Transparent | Transparent |
| pH (Before Start of Reaction) | 6.2 | 10.3 | 10.9 | 11.0 | 11.1 |
| Reaction Temperature | 90° C. | 90° C. | 90° C. | 90° C. | 90° C. |
| Reaction Time | 60 min | 60 min | 60 min | 60 min | 60 min |
| pH (After Reaction) | 5.8 | 10.1 | 10.9 | 10.9 | 11.0 |
| Evaluation 1: Reaction Solution Transmission Factor 10 Minutes after 90° C. | 99.6 ○ | 2.1 x | 51.3 ○ | 58.5 ○ | 62.6 ○ |
| Evaluation 2: Reaction Solution Transmission Factor 30 Minutes after 90° C. | 99.4 ○ | 1.0 x | 37.1 ○ | 39.6 ○ | 45.1 ○ |
| Evaluation 3: Film Coverage over Glass Substrate | x | ○ | x | x | x |
| Evaluation 4: Film Coverage over CIGS Layer | x | ○ | x | x | x |
| Evaluation 5: Colloid Particle Adhesion | Not Evaluated | x | Not Evaluated | Not Evaluated | Not Evaluated |

TABLE 6

|  | Comparative Example 6 | Comparative Example 7 | Comparative Example 8 | Comparative Example 9 | Comparative Example 10 |
| --- | --- | --- | --- | --- | --- |
| Substrate | CIGS/Mo/SLG | CIGS/Mo/SLG | CIGS/Mo/SLG | CIGS/Mo/SLG | CIGS/Mo/SLG |
| W/WO Fine Particle Layer | With | Without X | With | Without X | With |
| Fine Particle Layer Forming Method | Spin Coating | — | Spin Coating | — | Spin Coating |
| Reaction Solution | Reaction Solution 9 X | Reaction Solution 20 | Reaction Solution 21 X | Reaction Solution 19 X | Reaction Solution 10 X |
| Appearance of Reaction Solution (Before Start of Reaction) | Transparent | Transparent | Transparent | White Opaque (Sediment) | White Opaque (Sediment) |
| pH (Before Start of Reaction) | 11.3 | 11.2 | 11.3 | 9.6 | 13.3 |
| Reaction Temperature | 90° C. | 90° C. | 90° C. | 90° C. | 90° C. |
| Reaction Time | 60 min | 60 min | 60 min | 60 min | 60 min |
| pH (After Reaction) | 11.3 | 11.2 | 11.3 | 9.4 | 13.1 |
| Evaluation 1: Reaction Solution Transmission Factor 10 Minutes after 90° C. | 72.8 ○ | 60.2 ○ | 61.3 ○ | 5.2 x | 2.9 x |
| Evaluation 2: Reaction Solution Transmission Factor 30 Minutes after 90° C. | 55.4 ○ | 42.3 ○ | 43.9 ○ | 3.8 x | 2.4 x |
| Evaluation 3: Film Coverage over Glass Substrate | x | x | x | x | x |
| Evaluation 4: Film Coverage over CIGS Layer | x | x | x | x | x |
| Evaluation 5: Colloid Particle Adhesion | Not Evaluated | Not Evaluated | Not Evaluated | Not Evaluated | Not Evaluated |

The buffer layer and the buffer layer manufacturing method of the present invention may be applied to a photoelectric conversion device for use in solar cells, infrared sensors, and the like.

What is claimed is:

1. A method of manufacturing a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the method comprising:
   a fine particle layer forming step for forming a fine particle layer of a plurality of one kind or two or more kinds of fine particles consisting primarily of at least one kind selected from the group consisting of ZnS, Zn(S, O), and Zn(S, O, OH) on the photoelectric conversion semiconductor layer;
   a preparation step for preparing a reaction solution which includes a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:
   the concentration of the component (C) is 0.001 to 0.25M;
   the concentration of the component (N) is 0.41 to 1.0M; and the pH before the start of reaction is 9.0 to 12.0; and a film forming step for forming, using the reaction solution, a Zn compound layer consisting primarily of Zn(S, O) and/or Zn(S, O, OH) on the fine particle layer by a liquid phase method with a reaction temperature of 70 to 95° C., wherein, in the preparation step, an aqueous solution (I) which includes the component (Z), an aqueous solution (II) which includes the component (S), an aqueous solution (III) which includes the component (C), and an aqueous solution (IV) which includes the component (N) are prepared separately, then the aqueous solutions (I), (II), and (III) are mixed to obtain a mixed solution, and the aqueous solution (IV) is mixed in the mixed solution.

2. The method of claim 1, wherein, in the preparation step, the aqueous solution (III) is mixed after the aqueous solutions (I) and (II) are mixed.

3. The method of claim 1, wherein:
the concentration of the component (C) is 0.001 to 0.225M;
the concentration of the component (N) is 0.45 to 1.0M; and
the film forming step is performed with the reaction temperature of 75 to 90° C.

4. The method of claim 1, wherein a reaction solution whose pH after reaction becomes 7.5 to 11.0 is used as the reaction solution in the film forming step.

5. The method of claim 1, wherein a reaction solution which includes at least one kind selected from the group consisting of zinc sulfate, zinc acetate, zinc nitrate, and hydrates thereof is used as the component (Z) of the reaction solution in the preparation step.

6. The method of claim 1, wherein a reaction solution which includes thiourea is used as the component (S) of the reaction solution in the preparation step.

7. The method of claim 1, wherein a reaction solution which includes sodium citrate and/or a hydrate thereof is used as the component (C) of the reaction solution in the preparation step.

8. The method of claim 1, wherein the fine particle layer forming step is performed by a method that applies a dispersion liquid which includes the plurality of fine particles or by a CBD (chemical bath deposition) method that deposits the plurality of fine particles.

9. A method of manufacturing a photoelectric conversion device having a stacked structure in which a lower electrode, a photoelectric conversion semiconductor layer that generates a current by absorbing light, a buffer layer, a window layer, a translucent conductive layer, and an upper electrode are stacked on a substrate, wherein the buffer layer is manufactured by the method of claim 1 and wherein a major component of the photoelectric conversion semiconductor layer is at least one kind of compound semiconductor having a chalcopyrite structure.

10. The method of claim 9, wherein the at least one kind of compound semiconductor is a semiconductor formed of a group Ib element, a group IIIb element, and a group VIb element.

11. The method of claim 10, wherein:
the group Ib element is at least one kind of element selected from the group consisting of Cu and Ag;
the group IIIb element is at least one kind of element selected from the group consisting of Al, Ga, and In; and
the group VIb element is at least one kind of element selected from the group consisting of S, Se, and Te.

12. A method of manufacturing a photoelectric conversion device having a stacked structure in which a lower electrode, a photoelectric conversion semiconductor layer that generates a current by absorbing light, a buffer layer, a window layer, a translucent conductive layer, and an upper electrode are stacked on a substrate, wherein the buffer layer is manufactured by the method of claim 1 and wherein an anodized substrate selected from the group consisting of an anodized substrate formed of an Al-based Al base with an $Al_2O_3$-based anodized film formed on at least one surface side, an anodized substrate formed of a compound base of a Fe-based Fe material and an Al-based Al material attached to at least one surface side of the Fe material with an $Al_2O_3$-based anodized film formed on at least one surface side of the compound base, and an anodized substrate formed of a base of a Fe-based Fe material and an Al-based Al film formed on at least one surface side of the Fe material with an $Al_2O_3$-based anodized film formed on at least one surface side of the base is used as the substrate.

13. A reaction solution for use in manufacturing a Zn compound layer consisting primarily of Zn (S, O) and/or Zn(S, O, OH) included in a buffer layer of a photoelectric conversion device having a stacked structure in which a lower electrode, a photoelectric conversion semiconductor layer that generates a current by absorbing light, the buffer layer, a translucent conductive layer, and an upper electrode are stacked on a substrate, the solution comprising:
a component (Z) of at least one kind of zinc source, a component (S) of at least one kind of sulfur source, a component (C) of at least one kind of citrate compound, a component (N) of at least one kind selected from the group consisting of ammonia and ammonium salt, and water, wherein:
the concentration of the component (C) is 0.001 to 0.25M;
the concentration of the component (N) is 0.41 to 1.0M; and
the pH before the start of reaction is 9.0 to 12.0.

14. The reaction solution of claim 13, wherein the concentration of the component (C) is 0.001 to 0.225M, the concentration of the component (N) is 0.45 to 1.0M, and the pH before the start of reaction is 9.0 to 12.0.

15. The reaction solution of claim 14, wherein the pH after reaction is 7.5 to 11.0.

16. The reaction solution of claim 14, wherein the solution includes at least one kind selected from the group consisting of zinc sulfate, zinc acetate, zinc nitrate, and hydrates thereof as the component (Z).

17. The reaction solution of claim 14, wherein the solution includes thiourea as the component (S).

18. The reaction solution of claim 14, wherein the solution includes sodium citrate and/or a hydrate thereof as the component (C).

19. The reaction solution of claim 14, wherein the reaction solution has a transmission factor of 15% or higher measured with a wavelength of 550 nm in a quartz cell having a light path length of 10 mm after being maintained at 90±3° C. for 10 minutes.

20. The reaction solution of claim 14, wherein the reaction solution has a transmission factor of 15% or higher measured with a wavelength of 550 nm in a quartz cell having a light path length of 10 mm after being maintained at 90±3° C. for 30 minutes.

21. A reaction solution preparation method, comprising:
an aqueous solution preparation step for preparing an aqueous solution (I) which includes a component (Z) of at least one kind of zinc source, an aqueous solution (II) which includes a component (S) of at least one kind of sulfur source, an aqueous solution (III) which includes a component (C) of at least one kind of citrate compound, and an aqueous solution (IV) which includes a component (N) of at least one kind selected from the group consisting of ammonia and ammonium salt; and an aqueous solution mixing step for mixing the aqueous solutions (I) to (IV), wherein, in the aqueous solution mixing step, the aqueous solutions (I), (II), and (III) are mixed to obtain a mixed solution and the aqueous solution (IV) is mixed in the mixed solution.

* * * * *